United States Patent [19]

Bergmann et al.

[11] Patent Number: 5,896,072
[45] Date of Patent: Apr. 20, 1999

[54] SURFACE ACOUSTIC WAVE FILTER HAVING A WEIGHTED REFLECTOR WITH SPACED FINGER GROUPS

[75] Inventors: Andreas Bergmann, Haiming; Jürgen Machui, München, both of Germany

[73] Assignee: Siemens Matsushita Components GmbH & Co. KG, Munich, Germany

[21] Appl. No.: 08/779,943

[22] Filed: Dec. 23, 1996

[30] Foreign Application Priority Data

Dec. 21, 1995 [DE] Germany .................. 195 48 042

[51] Int. Cl.⁶ .................................................. H03H 9/64
[52] U.S. Cl. ................... 333/195; 333/196; 310/313 D
[58] Field of Search .............................. 333/193–196; 310/313 R, 313 B, 313 C, 313 D

[56] References Cited

U.S. PATENT DOCUMENTS

| | | | |
|---|---|---|---|
| 4,267,534 | 5/1981 | Tanski | 333/194 X |
| 4,679,014 | 7/1987 | Bulst et al. | 310/313 D X |
| 5,051,644 | 9/1991 | Wright | 310/313 B |
| 5,379,010 | 1/1995 | Ruile et al. | 310/313 B X |
| 5,396,200 | 3/1995 | Manchui | 310/313 B X |
| 5,406,159 | 4/1995 | Wright | 310/313 D |
| 5,621,364 | 4/1997 | Ruile et al. | 310/313 D X |
| 5,703,427 | 12/1997 | Solal et al. | 310/313 D |

FOREIGN PATENT DOCUMENTS

| | | |
|---|---|---|
| 3942140A1 | 6/1991 | Germany . |
| 3942148A1 | 6/1991 | Germany . |

OTHER PUBLICATIONS

P.D. White et al.; "Synthesis and Design of Weighted Reflector Banks for SAW Resonators", *1978 Ultrasonics Symposium Proceedings*, Cherry Hill, NJ, USA (Sep. 25–27, 1978); pp. 634–638.

*Primary Examiner*—Robert Pascal
*Assistant Examiner*—Barbara Summons
*Attorney, Agent, or Firm*—Herbert L. Lerner; Laurence A. Greenberg

[57] ABSTRACT

A surface acoustic wave filter has one or more acoustic filter tracks. Each track has an input interdigital converter, an output interdigital converter, and a reflector. The reflector reflects surface waves between the input and output interdigital converter by 180°. The reflector is formed with a multiplicity of reflector electrode fingers which are combined into reflector finger groups. Mutually adjacent reflector finger groups are spaced apart by a defined spacing distance such that respective signals in adjacent reflector finger groups are superimposed in antiphase.

15 Claims, 3 Drawing Sheets

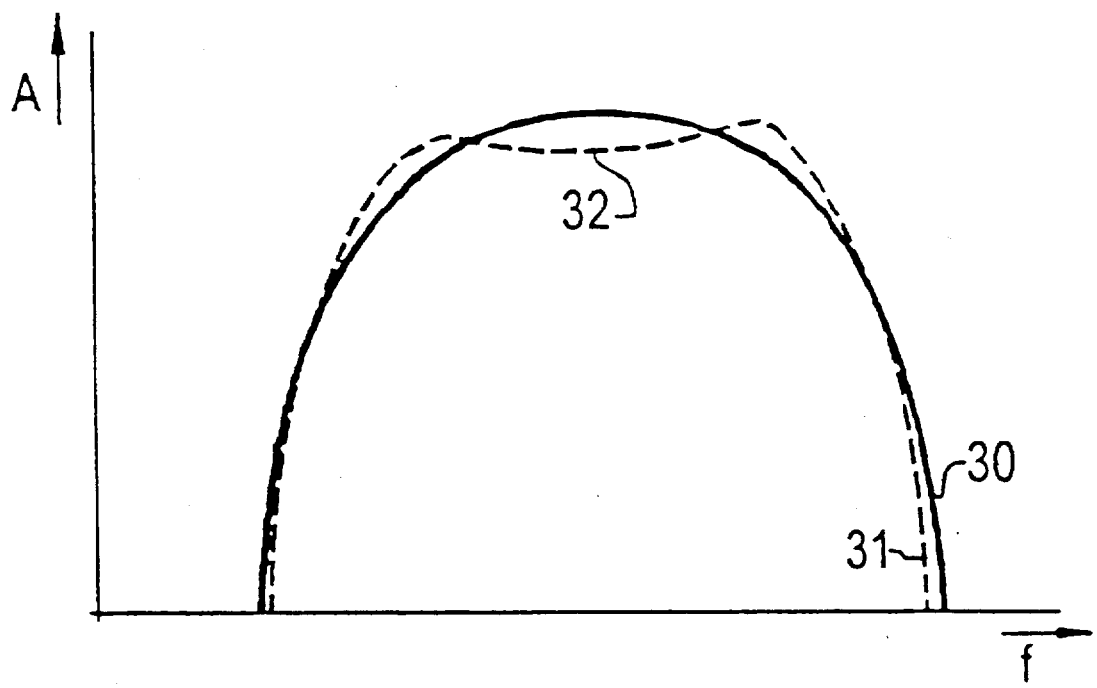

SURFACE ACOUSTIC WAVE FILTER HAVING A WEIGHTED REFLECTOR WITH SPACED FINGER GROUPS

BACKGROUND OF THE INVENTION

FIELD OF THE INVENTION

This invention relates to a filter operating with surface acoustic waves—so-called SAW filters—which have one or more acoustic tracks each containing at least one input interdigital converter, at least one output interdigital converter, and at least one reflector that reflects the surface wave in the acoustic track between the input and the output digital converter by 180°.

SAW filters of this kind are disclosed, for example, in U.S. Pat. No. 5,379,010 to Ruile et al. (German DE-OS 39 42 140). That SAW filter has an input converter and an output converter and at least one reflector that causes the surface acoustic wave to deflect by 180° on the path between the input converter and the output converter.

Filters for the mobile radio CDMA system must display a very high level of edge steepness with a relative bandwidth of, for example, 1.5%, in connection with an almost linear phase within the transmission band. Since the edge steepness for SAW filters is directly related to the length of the time window and thereby the length of a converter, it is not possible to realize such filters with a minimal chip length in the form of, for instance, a transversal filter. The advantage of a reflector, in comparison with a converter of the same length, is that, for a weighting through the round trip propagation of the surface acoustic wave, the time window made available is twice as long as that of the converter. In the case of a filter, the reflection of the reflector enters—along with the electroacoustic coupling of the input and output converter—directly into the transmission function of the filter.

Until now, flat transmission bands could only be attained with such filters using weighted converters which compensate for the convex form of the reflection function in a sub-section.

SUMMARY OF THE INVENTION

It is accordingly an object of the invention to provide a SAW filter, which overcomes the above-mentioned disadvantages of the heretofore-known devices and methods of this general type, which is shorter than filters with weighted converters and which has a flat transmission band.

With the foregoing and other objects in view there is provided, in accordance with the invention, a surface acoustic wave filter, comprising:

at least one acoustic track with an input interdigital converter, an output interdigital converter, and a reflector reflecting a surface wave between the input interdigital converter and the output interdigital converter by 180°;

the reflector having a multiplicity of reflector electrode fingers combined in reflector finger groups, the reflector finger groups being spaced apart by a defined spacing distance such that respective signals in adjacent reflector finger groups are superimposed in antiphase.

In accordance with an added feature of the invention, the reflector has an even number of reflector finger groups. Alternatively, the reflector has an odd number of reflector finger groups, such as three groups.

In accordance with an additional feature of the invention, the at least one acoustic track is one of two acoustic tracks each having one input interdigital converter, one output interdigital converter, and one reflector.

In accordance with another feature of the invention, the reflector is weighted. The reflector(s) may be overlapping-weighted, position-weighted, omission-weighted, strip-width-weighted, or various combinations thereof.

Other features which are considered as characteristic for the invention are set forth in the appended claims.

Although the invention is illustrated and described herein as embodied in a SAW filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagram illustrating the flat transmission band behavior of the filter according to the invention.

DESCRIPTION OF THE PREFERRED EMBODIMENTS

Figure 1:
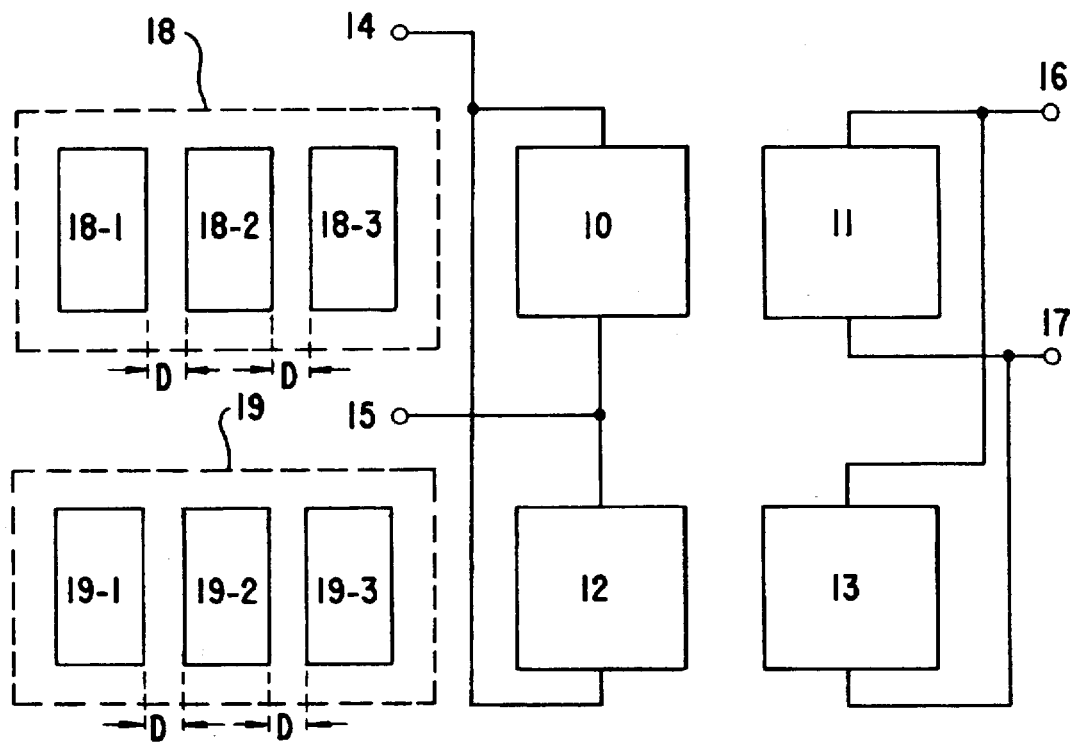
FIG. 1 is a schematic diagram of a SAW filter with two acoustic tracks.

Referring now to the figures of the drawing in detail and first, particularly, to FIG. 1 thereof, there is seen a SAW filter embodied, in accordance with the invention, with two acoustic tracks. Each of the acoustic tracks contain an input interdigital converter 10, 12 and an output interdigital converter 11, 13. The input interdigital converters 10, 12 are electrically connected to input terminals 14 and 15, as shown, and the output interdigital converters 11, 13 are connected to the output ports 16, 17.

In each of the two acoustic tracks there is disposed one reflector 18 or 19. Reflector electrode fingers—separately shown in FIG. 2a—are combined in groups 18-1, 18-2, 18-3 and 19-1, 19-2, 19-3, respectively. The individual groups of reflector electrode fingers are separated from each other by a distance D. The spacing distance D is chosen in accordance with the invention such that surface wave signals of any two adjacent groups of reflector electrode fingers are superimposed in antiphase (counter-phase).

SAW filters in accordance with the invention can thus be embodied particularly short if unweighted converters having a sin(x)/x-shaped transmission characteristic are used. A flat filter transmission band is attained by using reflectors embodied in accordance with the invention, the reflection function of which is concave in a sub-section. That situation is outlined in FIG. 3, which shows a reflector-reflection function through a dotted curve 31 and the electroacoustic converter coupling through a distended curve 30 as a function of a frequency f. The dimension on the ordinate is represented here with A. It is clear from FIG. 3 that the reflection function has a concave region 32 in accordance with curve 31, whereby a flat filter transmission band results from the overlapping of curves 30 and 31.

The reflection function of a reflector becomes concave in a sub-section when the signal originating from one group of reflection centers—i.e. the electrode strips of the reflector—is superimposed in a destructive manner on the main signal. The phase angle rotation required for this is achieved through a position shift, i.e. the combining of the electrode fingers or reflection centers in groups, and selection of their distance in accordance with the invention. If the distance between the n-th reflection center and the reflection centers contributing to the main signal $(m+\frac{1}{2}) \times \lambda/2$, the signal of the n-th reflection center is superimposed in a destructive manner on the main signal (where n and m are each integers and $\lambda$ is the wavelength of the surface acoustic wave). If multiple reflections in the reflector are disregarded, weighting functions from a linear design of overlapping-weighted converters can be taken as the base for the reflector design. Locally differing reflections can be achieved through omission-weighting or strip-width-weighting. A combination of strip-width-weighting with position or omission-weighting is also possible. The converters can be overlapping-weighted or omission-weighted converters.

Figure 2A:
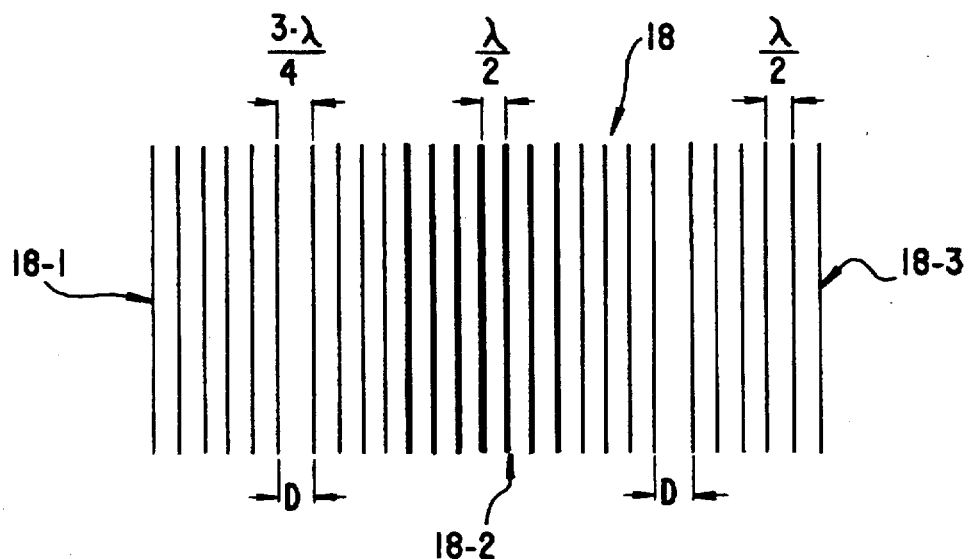
FIG. 2a is a schematic view of a strip-width-weighted reflector which may be used in the filter of FIG. 1.

FIG. 2a shows one possible embodiment of a reflector in accordance with the invention. The reflector of FIG. 2a, referenced 18 in accordance with FIG. 1, contains three groups of electrode fingers 18-1, 18-2, 18-3, with a spacing distance D between these groups. This is a strip-width-weighted reflector, for which the distance between the electrode fingers is $\lambda/2$, and the distance D between the electrode finger groups is $\frac{3}{4}\lambda$.

Figure 2B:
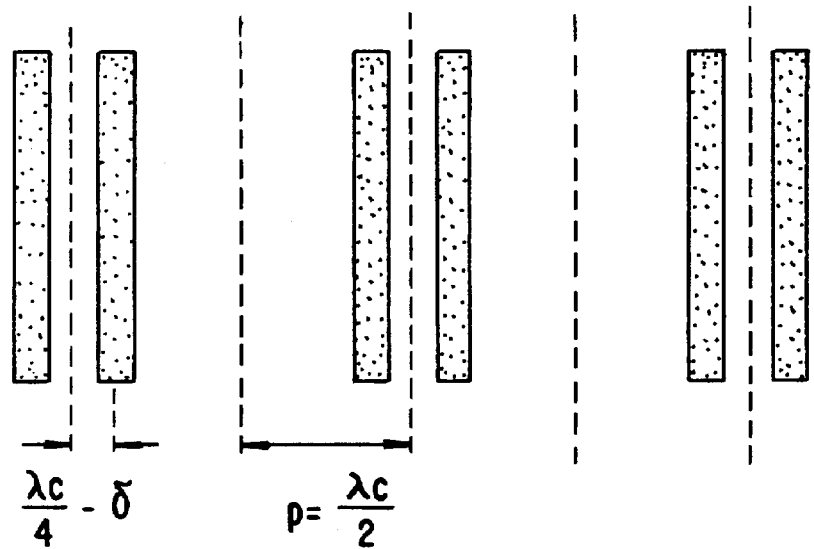
FIG. 2b is a schematic view of a position-weighted reflector which may be used in the filter of FIG. 1.

FIG. 2b shows another possible embodiment of a reflector in accordance with the invention. The reflector of FIG. 2b illustrates a position-weighting reflector, wherein $\lambda_r/2$ is the distance between the centers of two adjacent strips and $\delta$ is a shift in position with respect to equidistant positions of the strips.

Figure 2C:
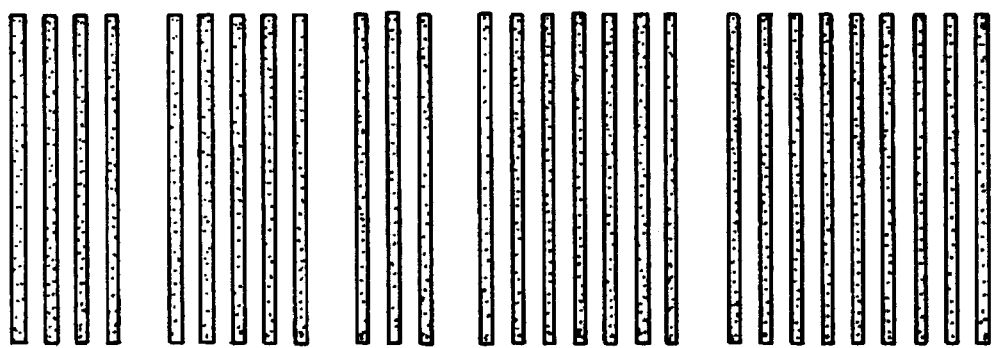
FIG. 2c is a schematic view of an omission-weighted reflector which may be used in the filter of FIG. 1.

FIG. 2c shows a further possible embodiment of a reflector in accordance with the invention. The reflector of FIG. 2c illustrates an omission-weighted reflector, wherein some of the reflector strips in a periodic strip pattern are omitted.

The embodiment of reflectors in accordance with the invention is not restricted to electrode finger groups of three. Groups having even or odd numbers of electrode fingers are possible. Furthermore, the embodiment of SAW filters in accordance with the invention is not restricted to filters having two acoustic tracks in accordance with the embodiment shown in FIG. 1.

We claim:

1. A surface acoustic wave filter, comprising:

at least one acoustic track with an input interdigital converter, an output interdigital converter, and a weighted reflector reflecting a surface wave between said input interdigital converter and said output interdigital converter by 180°;

said weighted reflector having a multiplicity of reflector electrode fingers combined in reflector finger groups, said reflector finger groups being spaced apart by a defined spacing distance such that respective signals in adjacent reflector finger groups are superimposed in antiphase and a reflected signal is formed such that a flat transmission band results.

2. The SAW filter according to claim 1, wherein said reflector has an even number of reflector finger groups.

3. The SAW filter according to claim 1, wherein said reflector has an odd number of reflector finger groups.

4. The SAW filter according to claim 3, wherein said reflector has three reflector finger groups.

5. The SAW filter according to claim 1, wherein said at least one acoustic track is one of two acoustic tracks each having one said input interdigital converter, one said output interdigital converter, and one said reflector.

6. The SAW filter according to claim 5, wherein each said reflector is an omission-weighted reflector.

7. The SAW filter according to claim 5, wherein each said reflector is a strip-width-weighted reflector.

8. The SAW filter according to claim 5, wherein each said reflector is a position-weighted reflector.

9. The SAW filter according to claim 5, wherein each said reflector is a weighted reflector having a weighting chosen from the group consisting of position-weighting, omission-weighting, and strip-width-weighting.

10. The SAW filter according to claim 1, wherein said reflector is a position-weighted reflector.

11. The SAW filter according to claim 1, wherein said weighted reflector has a weighting selected from the group consisting of position-weighting, omission-weighting, and strip-width-weighting.

12. The SAW filter according to claim 1, wherein said interdigital converters are overlapping-weighted interdigital converters.

13. The SAW filter according to claim 1, wherein said interdigital converters are omission-weighted interdigital converters.

14. The SAW filter according to claim 1, wherein said reflector is an omission-weighted reflector.

15. The SAW filter according to claim 1, wherein said reflector is a strip-width-weighted reflector.

* * * * *